United States Patent
Lu et al.

(10) Patent No.: US 11,143,690 B2
(45) Date of Patent: Oct. 12, 2021

(54) TESTING STRUCTURE AND TESTING METHOD

(71) Applicant: NANYA TECHNOLOGY CORPORATION, New Taipei (TW)

(72) Inventors: Hsueh-Han Lu, New Taipei (TW); Jui-Hsiu Jao, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 153 days.

(21) Appl. No.: 16/591,607

(22) Filed: Oct. 2, 2019

(65) Prior Publication Data

US 2021/0102990 A1    Apr. 8, 2021

(51) Int. Cl.
*G01R 31/26* (2020.01)
*G01R 27/26* (2006.01)
*H01L 23/522* (2006.01)

(52) U.S. Cl.
CPC ..... *G01R 31/2607* (2013.01); *G01R 27/2605* (2013.01); *H01L 23/5222* (2013.01)

(58) Field of Classification Search
CPC ............ G01R 31/2607; G01R 27/2605; H01L 23/5222
USPC .......................................................... 324/659
See application file for complete search history.

(56) References Cited

U.S. PATENT DOCUMENTS

2008/0176046 A1* 7/2008 Yamaguchi ............ B32B 38/10
428/195.1
2010/0156453 A1* 6/2010 Doong ............... G01R 31/2853
324/762.01

* cited by examiner

*Primary Examiner* — Farhana A Hoque
(74) *Attorney, Agent, or Firm* — CKC & Partners Co., LLC

(57) ABSTRACT

A testing structure is disclosed. The testing structure includes a first layer, a second layer, and a third layer. The first layer includes a first pattern. The third layer includes a second pattern. The first layer, the second layer, and the third layer overlap each other. The second layer is connected to a CBCM (charged based capacitance measurement) testing circuit.

8 Claims, 3 Drawing Sheets

200

500

TESTING STRUCTURE AND TESTING METHOD

BACKGROUND

Technical Field

The present disclosure relates to a testing structure and a testing method. More particularly, the present disclosure relates to a testing structure and a testing method for detecting several layers with a stacking structure.

Description of Related Art

As the transistor size continues to shrink, the interconnect delay determines the performance of the circuit. In addition, when the interconnect become multi-layer, more complex and closer, the cross-coupling effect between the two wires becomes a source of noise, which may cause chip failures. Therefore, it is important and desirable to extract accurate interconnect parameters for circuit simulation or for circuit failure analysis.

Several test structures are proposed to measure the interconnect coupling capacitance. One of the method is CBCM (charge based capacitance measurement), the value of the loaded capacitor is derived using the average current supplied to the inverter and the given clock frequency.

However, the CBCM testing structure could only measure the parasitic capacitance of various interconnects, which causes the TEG (test element group) design need large interconnect structure to calculate capacitance.

SUMMARY

An aspect of the present disclosure is to provide a testing structure, including a first layer, a second layer, and a third layer. The first layer includes a first pattern. The third layer includes a second pattern. The first layer, the second layer, and the third layer overlap each other. The second layer is connected to a CBCM (charged based capacitance measurement) testing circuit.

Another aspect of the present disclosure is to provide a testing method, suitable for a testing structure including a first layer, a second layer, and a third layer. The testing method includes the following operations: testing the second layer by a CBCM (charged based capacitance measurement) testing circuit; and testing the first layer and the third layer by another circuit. The first layer comprises a first pattern and the third layer comprises a second pattern, wherein the first layer, the second layer, and the third layer overlap each other.

In sum, the embodiments of the present disclosure are to provide a testing structure and a testing method, so as to monitor not only the parasitic capacitance of various structures but also the resistance and leakage of other interconnect layer. Furthermore, the volume for measuring testing the TEG (testing element group) is smaller as well.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
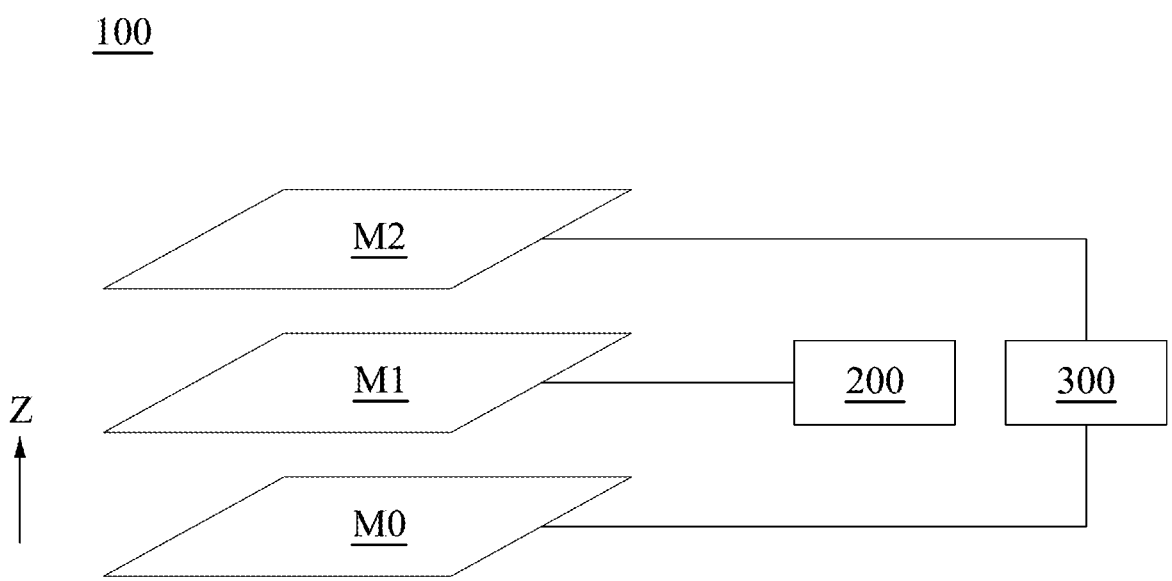
FIG. 1 is a schematic diagram of a testing structure according to some embodiments of the present disclosure.

Reference is made to FIG. 1. FIG. 1 is a schematic diagram of a testing structure 100 according to some embodiments of the present disclosure. The testing structure 100 includes layers M0, M1, and M2. The layer M0 includes a first pattern, and the layer M2 includes a second pattern. The layers M0, M1, and M2 overlap each other. The layer M1 is set above the layer M0, and the layer M2 is set above the layer M1. In some embodiments, the layers M0, M1, and M2 do not touch each other. The layers M0, M1, and M2 include circuits and/or layout respectively.

Figure 2:
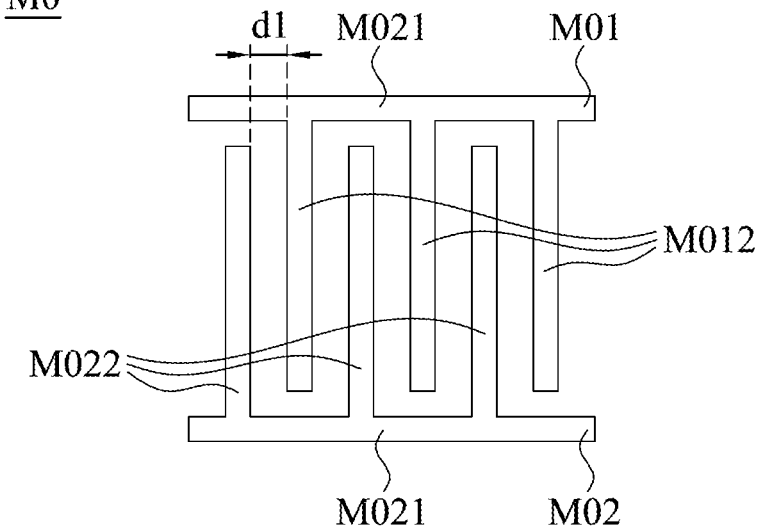
FIG. 2 is a schematic diagram of a layer according to some embodiments of the present disclosure.
Figure 2:
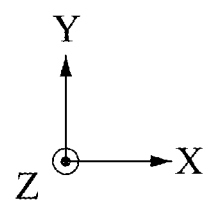

Reference is made to FIG. 2. FIG. 2 is a schematic diagram of a layer M0 according to some embodiments of the present disclosure. In some embodiments, the pattern of the layer M0 is a comb structure, as illustrated in FIG. 2. The comb structure includes portions M01 and M02. The portion M01 includes segments M011 and M012. The portion M02 includes segments M021 and M022. The segment M011 extends in the X direction. The segments M012 extends in the Y direction and an end of each of the segments M012 is connected to the segment M011. The segment M021 extends in the X direction. The segment M022 extends in the Y direction and an end of each of the segments M022 is connected to the segment M011. The segments M012 and M022 are alternated arranged with a fixed spacing d1. In some embodiments, the value of the spacing d1 may be 50 nm-100 nm.

Figure 3:
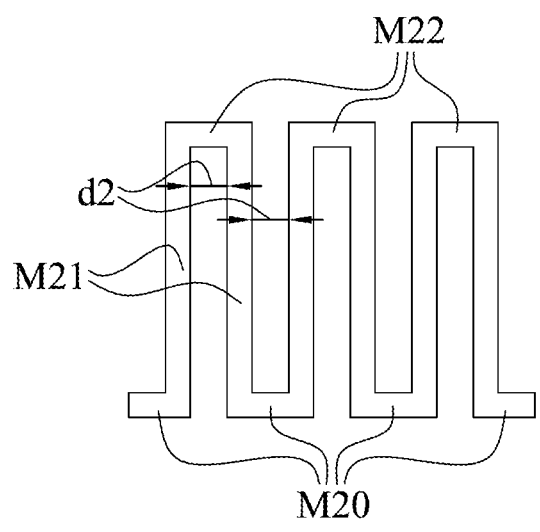
FIG. 3 is a schematic diagram of a layer according to some embodiments of the present disclosure.
Figure 3:
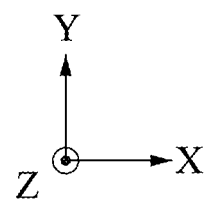

Reference is made to FIG. 3. FIG. 3 is a schematic diagram of a layer M2 according to some embodiments of the present disclosure. In some embodiments, the pattern of the layer M2 is a serpentine structure, as illustrated in FIG. 3. The serpentine structure includes segments M20, M21, and M22. The segments M20 are parallel arranged with a fixed spacing d2 and the segments M20 extend in the X direction. The segments M22 are parallel arranged with a fixed spacing d2 and the segments M20 extend in the X direction. The segments M21 are parallel arranged with a fixed spacing d2 and the segments M21 extend in the Y direction. The segments M21 are perpendicular to the segments M20 and M22. One end of each of the segments M21 are connected to the segments M20, and another end of each of the segments M21 are connected to the segments M22. In some embodiments, the value of the spacing d2 may be 50 nm-100 nm.

During testing, the layer M1 is connected to a CBCM (charged based capacitance measurement) testing circuit 200, as illustrated in FIG. 1. The CBCM testing circuit 200 is configured to test the parasitic capacitance of the circuits and/or layout of the layer M1. On the other hand, the layers M2 and M1 are connected to another testing circuit 300, so as to test whether the wires or the designs of the layers M2 and/or M1 are open or short. In some embodiments, the leakage current of the layers M2 and/or M1 may be tested by the testing circuit 300 as well.

Figure 4:
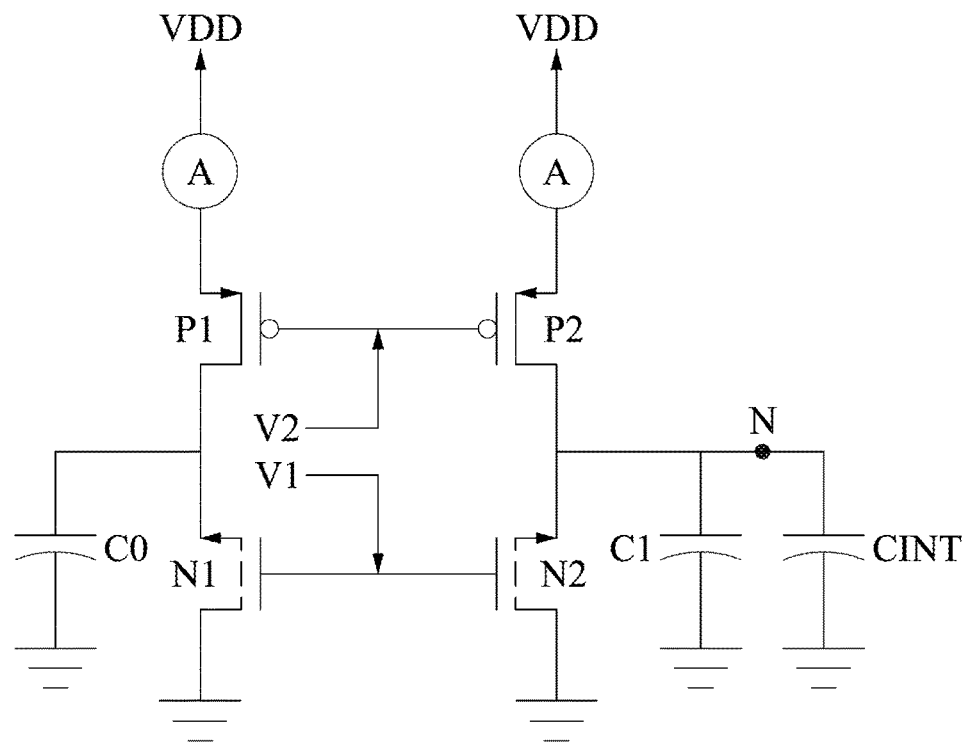
FIG. 4 is a schematic diagram of a CBCM testing circuit according to some embodiments of the present disclosure.

Reference is made to FIG. 4. FIG. 4 is a schematic diagram of a CBCM testing circuit 200 according to some embodiments of the present disclosure. As illustrated in FIG. 4, the CBCM testing circuit 200 includes two PMOS, two NMOS, and two capacitors. The PMOS P1 is connected to the NMOS N1 and the capacitor C0. The PMOS P2 is connected to the NMOS N2 and the capacitor C2. The capacitor CINT represents the interconnect capacitance of the layer M1. During the testing operation, the layer M1 is connected to the CBCM testing circuit 200 through the node N, and the CBCM testing circuit 200 tests the interconnect capacitance of the layer M1.

Figure 5:
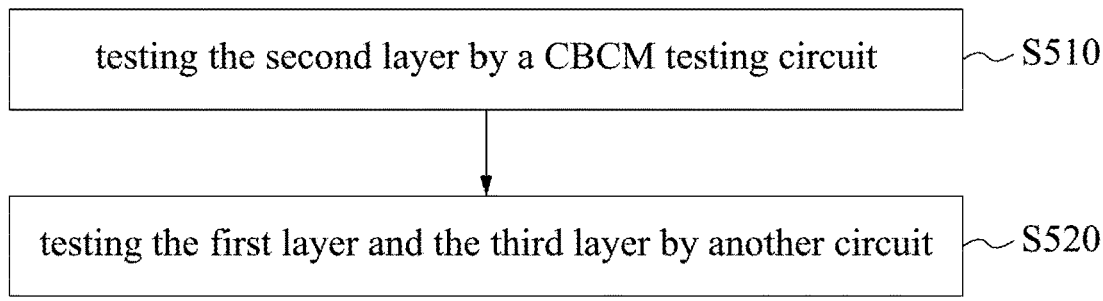
FIG. 5 is a flowchart illustrating a testing method in accordance with some embodiments of the present disclosure.

FIG. 5 is a flowchart illustrating a testing method 500 in accordance with some embodiments of the present disclosure. It should be noted that the testing method 500 can be applied to the testing structure 100 or having a structure that is the same as or similar to the structure of the testing structure 100 shown in FIG. 1. To simplify the description below, the embodiments shown in FIG. 1 will be used as an example to describe the testing method 500 according to some embodiments of the present disclosure. However, the present disclosure is not limited to application to the embodiments shown in FIG. 1. As shown in FIG. 5, the testing method 500 includes operations S510 to S520.

In operation S510, testing the second layer by a CBCM testing circuit. In some embodiments, operation S210 may be operated by the testing circuit 200 as illustrated in FIG. 1 and FIG. 4.

In operation S520, testing the first layer and the third layer by another circuit. In some embodiments, operation S230 may be operated by the testing circuit 300 as illustrated in FIG. 1.

It should be noted that the testing method 500 is suitable for the testing structure as illustrated in FIG. 1, in which the layers M0, M1, and M2 overlap each other. The layer M0 includes a first pattern, and the layer M2 includes another pattern.

The material of the layer M1 may be poly or metal, and the embodiments of the present disclosure are not limited thereto. It should be noted that, the patterns of the layers M0 and M2 mentioning above are for illustrative purposes only, the patterns of the layers M0 and M2 may be a comb structure, a serpentine structure, or a cross-bridge structure, and the embodiments of the present disclosure are not limited thereto.

The testing circuit 200 mentioning in FIG. 4 is for illustrative purposes only, and the embodiments of the present disclosure are not limited thereto. In some embodiments, the testing circuit 200 may be a testing circuit or any other circuits with the function of testing the interconnect capacitance of the layer or other similar functions. In some embodiments, the testing circuit 200 may be a testing circuit or any other circuits with the function of testing the open/short/current leakage of the layer or other similar functions.

According to the embodiment of the present disclosure, it is understood that the embodiments of the present disclosure are to provide a testing structure and a testing method, so as to monitor not only the parasitic capacitance of various structures but also the resistance and leakage of other interconnect layer. Furthermore, the volume for measuring testing the TEG (testing element group) is smaller as well.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A testing structure, comprising:
a first layer, comprising a first pattern;
a second layer; and
a third layer, comprising a second pattern;
wherein the first layer, the second layer, and the third layer overlap each other,
wherein the second layer is connected to a CBCM (charged based capacitance measurement) testing circuit;
wherein a parasitic capacitance of the second layer is tested by the CBCM testing circuit, and at least one circuit property of the first layer and at least one circuit property of the third layer are tested by another testing circuit.

2. The testing structure of claim 1, wherein the first pattern is a comb structure.

3. The testing structure of claim 1, wherein the third pattern is a serpentine structure.

4. The testing structure of claim 1, wherein the second layer is set above the first layer and the third layer is set above the second layer.

5. A testing method, suitable for a testing structure including a first layer, a second layer, and a third layer, wherein the testing method comprises:
testing the second layer by a CBCM (charged based capacitance measurement) testing circuit; and
testing the first layer and the third layer by another circuit;

wherein the first layer comprises a first pattern and the third layer comprises a second pattern, wherein the first layer, the second layer, and the third layer overlap each other;

wherein a parasitic capacitance of the second layer is tested by the CBCM testing circuit, and at least one circuit property of the first layer and at least one circuit property of the third layer are tested by the another testing circuit.

6. The testing method of claim 5, wherein the first pattern is a comb structure.

7. The testing method of claim 5, wherein the third pattern is a serpentine structure.

8. The testing method of claim 5, wherein the second layer is set above the first layer and the third layer is set above the second layer.

* * * * *